United States Patent [19]

Okanobu et al.

[11] Patent Number: 5,757,921
[45] Date of Patent: May 26, 1998

[54] RADIO COMMUNICATION APPARATUS HAVING COMMON OSCILLATOR APPLIED FOR PLL, CONVERSION AND SCRAMBLE/DESCRAMBLE CIRCUITS

[75] Inventors: Taiwa Okanobu, Tokyo; Nobuo Hareyama; Hiroshi Yokoyama, both of Kanagawa, all of Japan

[73] Assignee: Sony Corporation, Tokyo, Japan

[21] Appl. No.: 617,078

[22] Filed: Mar. 18, 1996

[30] Foreign Application Priority Data

Mar. 22, 1995 [JP] Japan ................... 7-088751

[51] Int. Cl.$^6$ ........................................ H04B 1/40
[52] U.S. Cl. ....................... 380/38; 455/86; 455/550
[58] Field of Search ....................... 455/76, 86, 87, 455/550; 380/38, 39

[56] References Cited

U.S. PATENT DOCUMENTS

| | | | |
|---|---|---|---|
| 4,627,099 | 12/1986 | Shimakata | 455/76 |
| 4,790,009 | 12/1988 | Ishigaki et al. | 380/9 |
| 5,168,522 | 12/1992 | Simanis et al. | 380/38 |
| 5,291,474 | 3/1994 | Ikonen et al. | 370/30 |
| 5,574,985 | 11/1996 | Ylikotila | 455/76 |

FOREIGN PATENT DOCUMENTS

| | | | |
|---|---|---|---|
| 0233935 | 9/1989 | Japan . | |
| 2220825 | 1/1990 | United Kingdom . | |
| 2279519 | 1/1995 | United Kingdom | H04B 1/40 |
| 9316530 | 8/1993 | WIPO | H04B 1/50 |
| 9515621 | 6/1995 | WIPO | H04B 1/40 |

OTHER PUBLICATIONS

Abstract of: T. Sato *Semiconductors for Cordless Telephones*, Mitsubishi Denki Giho, vol. 65, No. 12, pp. 88–94 (1991).

Abstract of: N. Kaiser et al. *Silicon–bipolar Chipset for STM-1 and STM-4 Fibre–Optic Transmission Modules*, Eur. Inst. Commun. & Networks (1993).

*Primary Examiner*—Gilberto Barron, Jr.
*Attorney, Agent, or Firm*—Jay H. Maioli

[57] ABSTRACT

A superheterodyne receiving circuit and a superheterodyne transmitting circuit are provided. A PLL forms a local oscillation signal in the receiving circuit, and a PLL forms a carrier signal in the signal transmitting circuit. A circuit converts digital data into signals suitable for transmission, and an oscillating circuit provides an oscillation signal. A frequency-dividing circuit forms a frequency-division signal of a reference frequency which is supplied to the PLLs by frequency-dividing the oscillation signal circuit, and a frequency-dividing circuit generates a clock signal required in the conversion circuit by frequency-dividing the oscillation signal. A frequency-dividing circuit forms a signal for descrambling the received voice signals which have been scrambled by frequency-dividing the oscillation signal, and a frequency-dividing circuit forms a signal for scrambling the voice signals to be transmitted by frequency-dividing the oscillation signal. In accordance with the invention, the essential circuitry of a cordless telephone set can be formed into a one-chip IC.

10 Claims, 6 Drawing Sheets

| CHANNEL NUMBER CHNO | TRANSMISSION FREQUENCY OF BASE TELEPHONE SET [MHz] | TRANSMISSION FREQUENCY OF SUB-TELEPHONE SET [MHz] |
|---|---|---|
| 1 | 380.2125 | 253.8625 |
| 2 | 380.2250 | 253.8750 |
| 3 | 380.2375 | 253.8875 |
| ... | ... | ... |
| 89 | 381.3125 | 254.9625 |

RADIO COMMUNICATION APPARATUS HAVING COMMON OSCILLATOR APPLIED FOR PLL, CONVERSION AND SCRAMBLE/ DESCRAMBLE CIRCUITS

BACKGROUND OF THE INVENTION

1. Field of the Invention

The present invention relates to an integrated circuit (IC) and a transmitter/receiver which uses such integrated circuit.

2. Description of the Related Art

A small-power-type cordless telephone set for use in Japan is assigned, for example, a frequency band for 89 channels. The relation between a channel number CHNO thereof and the transmission frequency (the receiving frequency when seen from a telephone set of another party) of a base telephone set and a sub-telephone set is shown in FIG. 1. All the frequency intervals corresponding to the channel intervals are constant at 12.5 kHz.

When transmission (or receiving) is performed at such a frequency, a PLL (Phase Locked Loop) is usually used. Since the frequency intervals between the channels are 12.5 kHz, the reference frequency of the PLL is 12.5 kHz. For this reason, the PLL requires a crystal oscillating circuit which oscillates at a frequency of the 2nd power of 12.5 kHz. In a cordless telephone set, when a request for connecting between a sub-telephone set and a base telephone set is made from the sub-telephone set to the base telephone set in order to originate a call, and when a request for connecting between a sub-telephone set and a base telephone set is made from the base telephone set to the sub-telephone set in order to receive a call, command signals indicating the request, the parameters, and the like are transmitted or received.

FIG. 2 shows an example of a signal format of a command signal CMND which has a bit synchronization signal BSYN of 16 bits at the beginning and then a frame synchronization signal FSYN of 16 bits. In this case, the synchronization signals BSYN and FSYN are formed into predetermined bit patterns, respectively. The bit patterns are made different between the frame synchronization signal FSYN which is transmitted from the sub-telephone set to the base telephone set and the frame synchronization signal FSYN which is transmitted from the base telephone set to the sub-telephone set.

Further, the command signal CMND, after the frame synchronization signal FSYN, has a system identification code SYID of 25 bits, an error correcting code ECC of 12 bits for the code SYID, and a control code CTRL of 5 bytes (40 bits). In this case, the system identification code SYID is data for distinguishing between the subject telephone set and the telephone set of another party. In the control code CTRL, the first byte is a code indicating the control contents of the sub-telephone set and the base telephone set, and the second to fifth bytes are parameters or data related to the first byte.

When the sub-telephone set or the base telephone set receives the command signal CMND, a check is made to determine if the identification code SYID included in the command signal CMND matches the identification code SYID stored in the subject telephone set. Only when they match, is the command signal CMND assumed to be valid, and when they do not match, the command signal CMND is assumed to be invalid.

In a case where the command signal CMND is transmitted or received between the sub-telephone set and the base telephone set, the command signal CMND is transmitted or received with the command signal CMND converted into an MSK (Minimum Shift Keying) signal.

In this case, the MSK signal is formed into one cycle of a sine-wave signal at a frequency of 2.4 kHz when the bit of the command signal CMND is "0", and is formed into a half cycle of a sine-wave signal at a frequency of 1.2 kHz when the bit of the command signal CMND is "1".

Therefore, in order to form such an MSK signal, a crystal oscillating circuit which oscillates at a frequency of an integral multiple of 2.4 kHz, for example, at a frequency of 4.8 MHz, becomes necessary.

Further, privacy conversation through a cordless telephone set is generally realized by the following way in which voice signals are transmitted after the frequency spectrum of voice signals is inverted, namely, scrambled, and the frequency spectrum of the inverted voice signals is reinverted, namely, descrambled, into its original frequency spectrum.

Therefore, a subcarrier signal with a stable frequency is necessary also for this privacy conversation. For this reason, a crystal oscillating circuit is also required.

As described above, in the cordless telephone set, at least three crystal oscillating circuits are necessary for each of the sub-telephone set and the base telephone set for the purpose of (1) setting a channel, (2) forming an MSK signal (transmitting a command signal), and (3) processing privacy conversation.

However, if a plurality of oscillating circuits are provided within one system, interference is likely to occur between these oscillating circuits. When, in particular, these oscillating circuits are formed into an IC, it is difficult to avoid interference.

Since, in practice, the oscillation signal of the crystal oscillating circuit is frequency-divided and used, a number of harmonic signals of the oscillation signal and the frequency-division signal will occur. Since the original oscillation signal has mutually independent oscillation frequencies, the harmonic signals thereof are mutually unrelated frequencies, and a new beat signal may occur. Such harmonic signals and such beat signal interfere with the system in various ways, and forming the circuit into an IC becomes difficult.

On the other hand, the transmitting/receiving circuits of the sub-telephone set and the base telephone set require various types of filters in order to, for example, limit the frequency band of voice signals and to eliminate spurious frequency components.

However, if these filters are provided externally to the IC, the number of external terminals (external connection pins) of the IC will increase. Further, an increase in the number of these external terminals necessitates that the whole of the transmitter/receiver circuit be divided into a plurality of ICs.

Even if the filter can be contained in the IC, the absolute values of the capacitor and the resistor vary greatly. Therefore, the cut-off characteristics of the filter vary greatly, and, as a result, the characteristics of the cordless telephone set are degraded.

SUMMARY OF THE INVENTION

The present invention aims to provide an IC for use in a transmitter/receiver which solves the above-described problems.

To achieve the above-described object, according to one aspect of the present invention, there is provided an integrated circuit, comprising: a superheterodyne receiving circuit; a transmitting circuit; a first PLL for forming a local oscillation signal in the receiving circuit; a second PLL for forming a carrier signal in the transmitting circuit; a circuit for converting digital data into signals suitable for transmission; an oscillating circuit for performing oscillation by a crystal oscillator; a frequency-dividing circuit for frequency-dividing the oscillation signal of the oscillating circuit and forming frequency-division signals of a reference frequency, which signals are supplied to the first and second PLLs; and a frequency-dividing circuit for frequency-dividing the oscillation signal and forming a clock required for the converting circuit.

Thus, transmission and reception are performed by one IC.

The above and further objects, aspects and novel features of the invention will become more apparent from the following detailed description when read in connection with the accompanying drawings.

DETAILED DESCRIPTION OF THE PREFERRED EMBODIMENTS

The Entire Construction and Operation (in the case of voice signals)

Figures 1, 2:
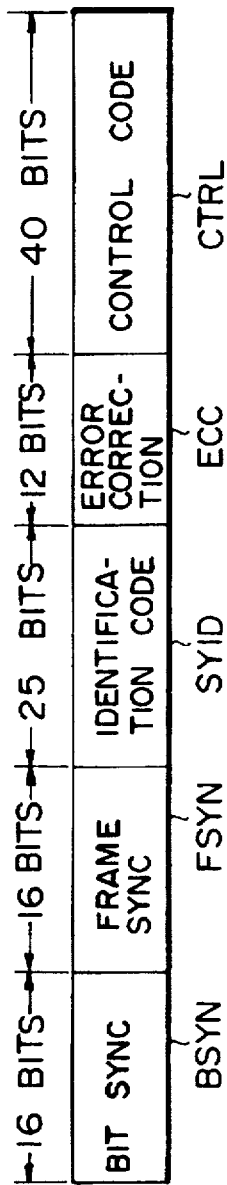
FIG. 1 shows an example of a frequency channel assignment according to the present invention.
FIG. 2 shows an example of a command signal according to the present invention.
Figure 3:
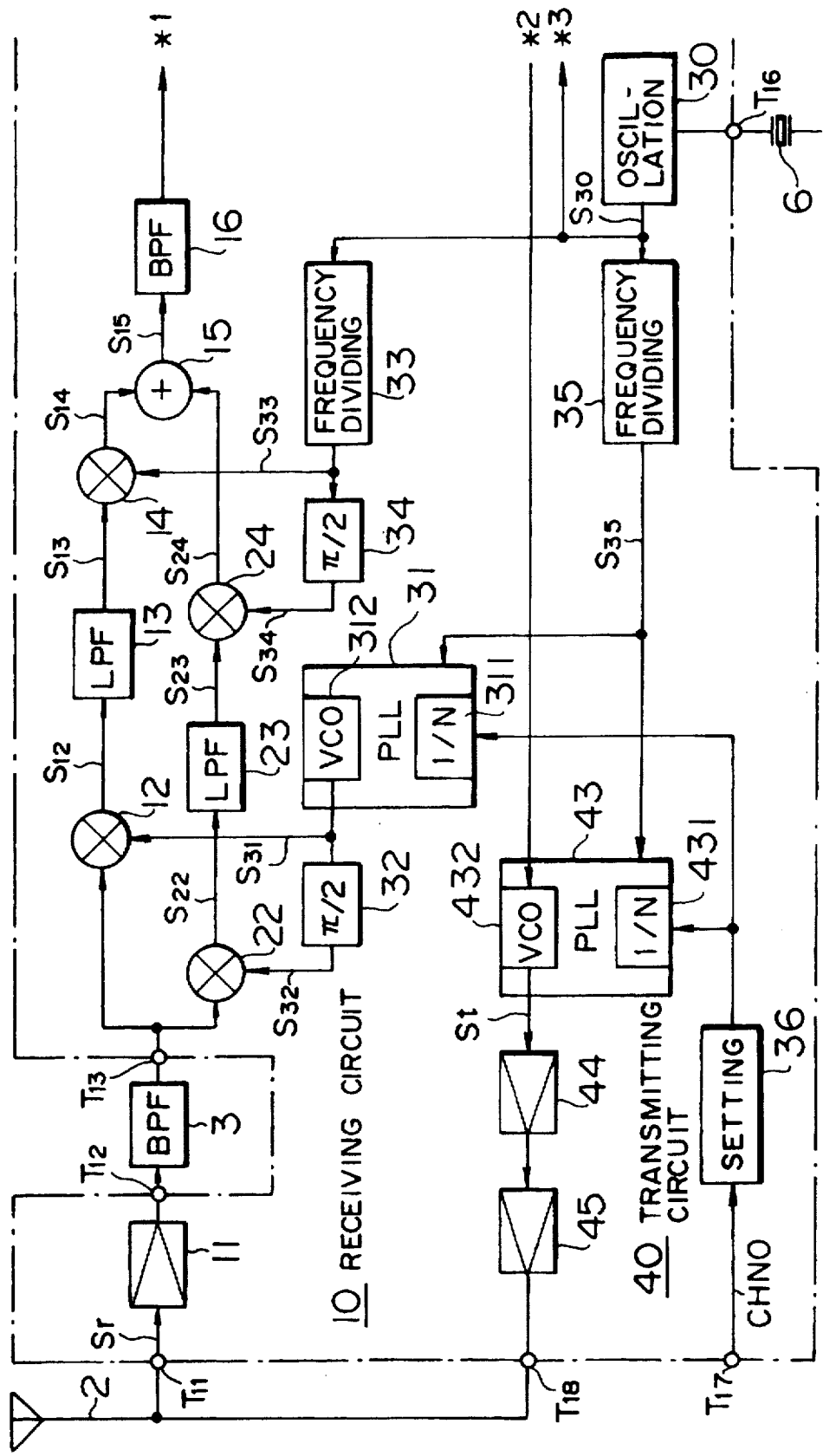
FIG. 3 is a part of a block diagram illustrating a sub-telephone set of a cordless telephone set according to the present invention.
Figure 4:
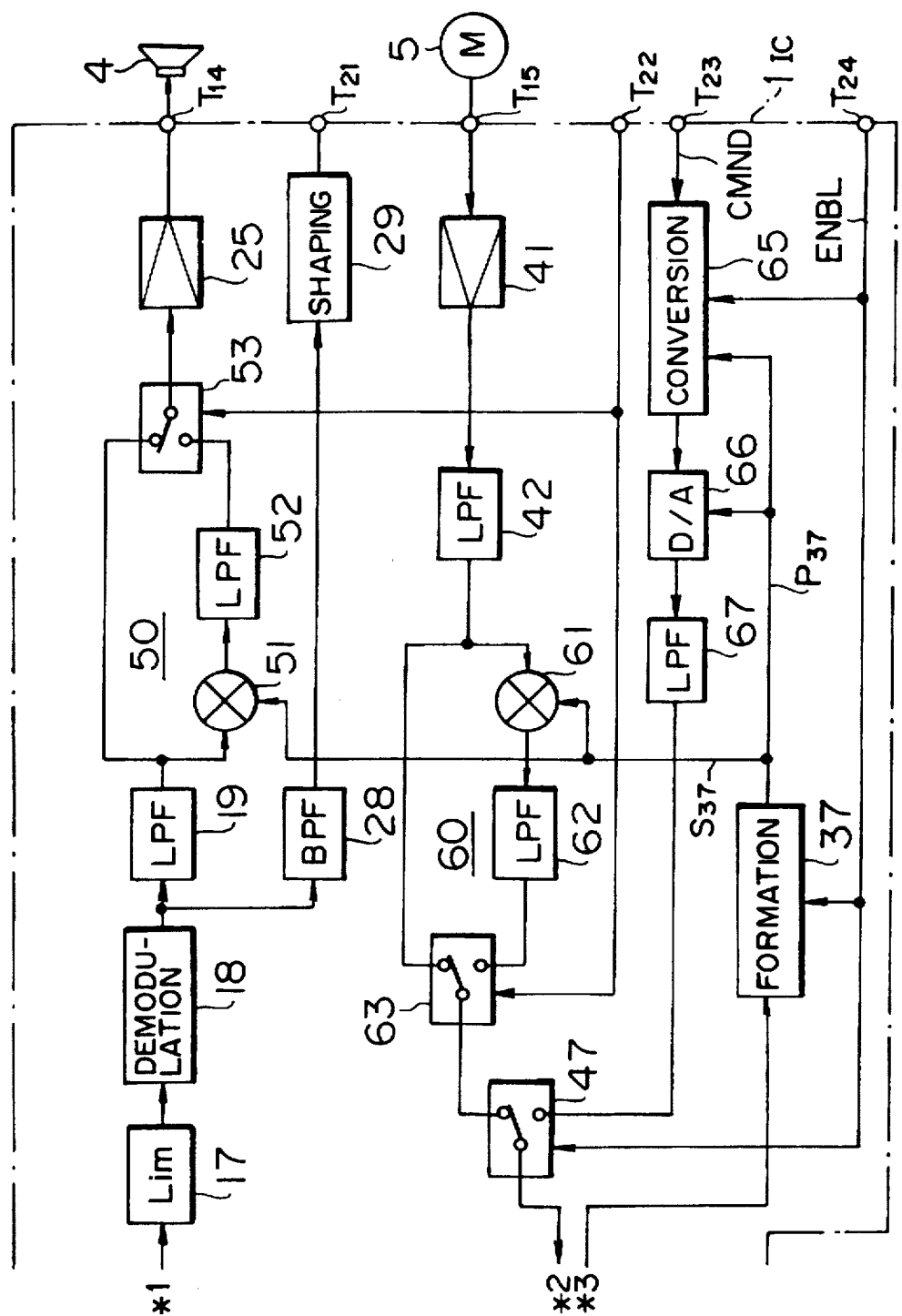
FIG. 4 is a block diagram illustrating an example of the continuation of FIG. 3.

FIGS. 3 and 4 show an example of a receiving circuit and a transmitting circuit of a cordless telephone set of the present invention in which the circuits are divided because the space of the figure is limited. *1 to *3 of FIG. 3 connect to *1 to *3 of FIG. 4. A portion 1 surrounded by a chain line is formed into one chip IC, and this embodiment describes a case in which the IC 1 is used in a sub-telephone set.

The IC 1 includes a receiving circuit 10 and a transmitting circuit 40. The receiving circuit 10 is formed into a double superheterodyne type. More specifically, an FM signal Sr of a down channel from a base telephone set is received by an antenna 2, passes through a signal line: a terminal T11→a terminal T12→a band-path filter 3 which passes all the down channels→a terminal T13, and is supplied to first mixer circuits 12 and 22 for I axis and Q axis of orthogonal transform.

The oscillating circuit 30 forms an oscillation signal S30 at a stable reference frequency, for example, 14.4 MHz. For this purpose, a crystal oscillator 6 is connected to the oscillating circuit 30 through a terminal T16, and thus a crystal oscillating circuit is formed.

The oscillation signal S30 is supplied to a frequency-dividing circuit 35 whereby the oscillation signal S30 is frequency-divided, for example, by 1152, i.e., to a signal S35 of a frequency of 12.5 kHz corresponding to the channel intervals. This signal S35 is supplied to a PLL 31 as a signal of that reference frequency.

Though the details will be described later, an oscillation signal S31 of a frequency equal to the carrier frequency of an FM signal Sr is taken from a VCO (Voltage Controlled Oscillator) 312 of the PLL 31. Since the carrier frequency of the received FM signal Sr is equal to the transmission frequency of the base telephone set, the frequency of the oscillation signal S31 is also equal to the transmission frequency of the base telephone set.

This signal S31 is supplied to a mixer circuit 12 as a first local oscillation signal, and supplied to a phase-shift circuit 32 whereby the signal S31 is shifted by $\pi/2$, and the phase-shifted signal S32 is supplied to a mixer circuit 22 as a first local oscillation signal.

Figure 5:
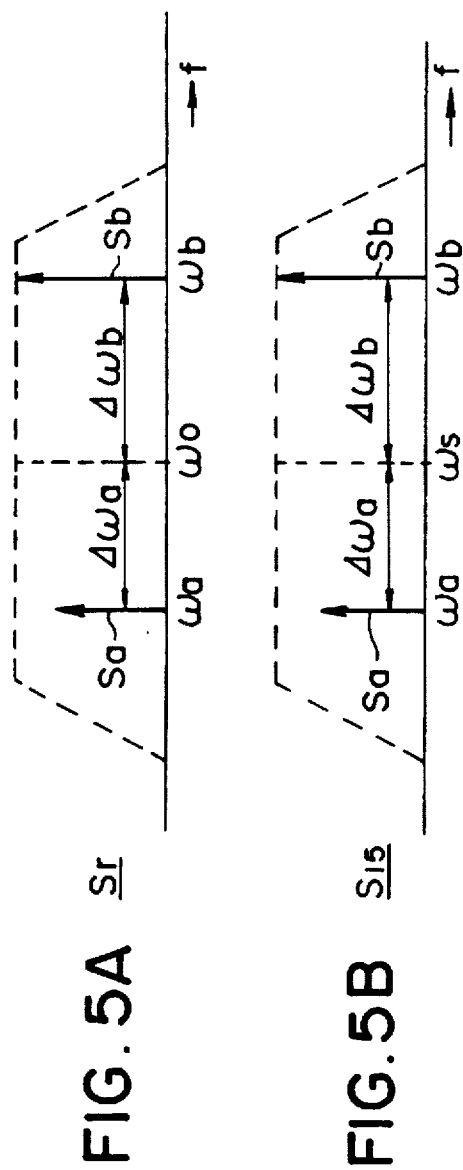
FIGS. 5A and 5B are frequency spectrum diagrams according to the present invention.

Therefore, for the sake of simplicity, as shown in FIG. 5A, if it is assumed that the received signal Sr has signal components Sa within its lower side band, and has signal components Sb within its upper side band, and $\omega 0$: the carrier frequency (angular frequency) of the received signal Sr $\omega a$: the angular frequency of signal components Sa.

$\omega a < \omega 0$

Ea: the amplitude of signal components Sa $\omega b$: the angular frequency of signal components Sb.

$\omega b > \omega 0$

Eb: the amplitude of signal components Sb $\Delta \omega a = \omega 0 - \omega a$ $\Delta \omega b = \omega - \omega 0$, then $Sr = Sa + Sb$ $Sa = Ea \cdot \sin \omega a t$ $Sb = Eb \cdot \sin \omega b t$ Also, if it is assumed that E1: the amplitude of the first local oscillation signals S31 and S32, $S31 = E1 \cdot \sin \omega o t$ pi $S32 = E1 \cdot \cos \omega o t$ Therefore, if it is assumed that S12 and S22: the output signals of the mixer circuits 12 and 22, $$S12 = Sr \cdot S31$$
$$= (Ea \cdot \sin \omega a t + Eb \cdot \sin \omega b t) \times E1 \cdot \sin \omega o t$$
$$= \alpha a\{-\cos(\omega a + \omega o)t + \cos(\omega o - \omega a)t\} +$$
$$\alpha b\{-\cos(\omega b + \omega o)t + \cos(\omega b - \omega o)t\}$$
$$= \alpha a\{-\cos(\omega a + \omega o)t + \cos\Delta\omega a t\} +$$
$$\alpha b\{-\cos(\omega b + \omega o)t + \cos\Delta\omega b t\}$$

-continued $$S22 = Sr \cdot S32$$

$$= (Ea \cdot \sin\omega a t + Eb \cdot \sin\omega b t) \times E1 \cdot \cos\omega o t$$

$$= \alpha a\{\sin(\omega a + \omega o)t - \sin(\omega o - \omega a)t\} +$$

$$\alpha b\{\sin(\omega b + \omega o)t + \sin(\omega b - \omega o)t\}$$

$$= \alpha a\{\sin(\omega a + \omega o)t - \sin\Delta\omega a t\} +$$

$$\alpha b\{\sin(\omega b + \omega o)t + \sin\Delta\omega b t\}$$

$$\alpha a = Ea \cdot E1/2$$

$$\alpha b = Eb \cdot E1/2$$

Since, of the above equations, the signal components of the angular frequencies $\Delta\omega a$ and $\Delta\omega b$ are necessary intermediate frequency signals, these signals S12 and S22 are supplied to low-pass filters 13 and 23. The signal components of the angular frequencies $\Delta\omega a$ and $\Delta\omega b$ are taken as the first intermediate frequency signals S13 and S23, and $$S13 = \alpha a \cdot \cos\Delta\omega a t + \alpha b \cdot \cos\Delta\omega b t$$

$$S23 = -\alpha a \cdot \sin\Delta\omega a t + \alpha b \cdot \sin\Delta\omega b t.$$

In this case, as is clear from the above equations and FIG. 5A, the signals S13 and S23 are baseband signals.

Further, these signals S13 and S23 are supplied to second mixer circuits 14 and 24 for I axis and Q axis of orthogonal transform.

The oscillation signal S30 of the oscillating circuit 30 is supplied to a frequency-dividing circuit 33 whereby the oscillation signal S30 is frequency-divided into a signal of a relatively low frequency, e.g., a signal S33 of a frequency of approximately 55 kHz as a result of being frequency-divided by 262. This signal S33 is supplied to the mixer circuit 14 as a second local oscillation signal and supplied to a phase-shift circuit 34 whereby the signal S33 is shifted by π/2, and a phase-shifted signal S34 is supplied to the mixer circuit 24 as a second local oscillation signal.

Therefore, if it is assumed that $$S33 = E2 \cdot \sin\omega s t$$

$$S34 = E2 \cdot \cos\omega s t$$

E2: the amplitude of the second local oscillation signals S33 and S34

$$\omega s = 2\pi fs$$

(fs=approximately 55 kHz).

If S14 and S24: the output signals of the second mixer circuits 14 and 24, $$S14 = S13 \cdot S33$$

$$= (\alpha a \cdot \cos\Delta\omega a t + \alpha b \cdot \cos\Delta\omega b t) \times E2 \cdot \sin\omega s t$$

$$= \beta a\{\sin(\Delta\omega a + \omega s)t - \sin(\Delta\omega a - \omega s)t\} +$$

$$\beta b\{\sin(\Delta\omega b + \omega s)t - \sin(\Delta\omega b - \omega s)t\}$$

$$S24 = S23 \cdot S34$$

$$= (-\alpha a \cdot \sin\Delta\omega a t + \alpha b \cdot \sin\Delta\omega b t) \times E2 \cdot \cos\omega s t$$

$$= -\beta a\{\sin(\Delta\omega a + \omega s)t + \sin(\Delta\omega a - \omega s)t\} +$$

$$\beta b\{\sin(\Delta\omega b + \omega s)t + \sin(\Delta\omega b - \omega s)t\}$$

-continued $$\beta a = \alpha a \cdot E2/2$$

$$\beta b = \alpha b \cdot E2/2$$

When the signals S14 and S24 are transformed so that the frequency difference does not become a negative value in these signals S14 and S24, $$S14 = \beta a\{\sin(\Delta\omega a + \omega s)t + \sin(\omega s - \Delta\omega a)t\} +$$

$$\beta b\{\sin(\Delta\omega b + \omega s)t + \sin(\omega s - \Delta\omega b)t\}$$

$$= \beta a \cdot \sin(\omega s + \Delta\omega a)t + \beta a \cdot \sin(\omega s - \Delta\omega a)t +$$

$$\beta b \cdot \sin(\omega s + \Delta\omega b)t + \beta b \cdot \sin(\omega s - \Delta\omega b)t$$

$$S24 = -\beta a\{\sin(\Delta\omega a + \omega s)t - \sin(\omega s - \Delta\omega a)t\} +$$

$$\beta b\{\sin(\Delta\omega b + \omega s)t - \sin(\omega s - \Delta\omega b)t\}$$

$$= -\beta a \cdot \sin(\omega s + \Delta\omega a)t + \beta a \cdot \sin(\omega s - \Delta\omega a)t +$$

$$\beta b \cdot \sin(\omega s + \Delta\omega b)t - \beta b \cdot \sin(\omega s - \Delta\omega b)t$$

Then, these signals S14 and S24 are supplied to an addition circuit 15 whereby the signals S14 and S24 are added together, and an addition signal S15 indicated as $$S15 = S14 + S24$$

$$= 2\beta a \cdot \sin(\omega s - \Delta\omega a)t + 2\beta b \cdot \sin(\omega s + \Delta\omega b)t$$

is taken from the addition circuit 15.

This addition signal S15 is shown in FIG. 5B. This addition signal S15 is simply the original received signal Sr which is frequency-converted into a signal of the carrier frequency (angular frequency) ωs. That is, the signal S15 is a second intermediate frequency signal of the intermediate frequency fs.

Hereupon, the second intermediate frequency signal S15 is supplied via a band-pass filter 16 for an intermediate frequency filter and a limiter amplifier 17 to an FM demodulation circuit 18 whereby the voice signals are demodulated. In this case, these voice signals, when not scrambled, are normal voice signals, and are voice signals whose frequency spectrum has been inverted when these signals have been scrambled by spectrum inversion.

When these voice signals have not been scrambled for privacy, a switch circuit 53 is connected in the state shown in the figure in accordance with a control signal from a terminal T22. Then, the voice signals from the demodulation circuit 18 are supplied to a speaker 4 for the telephone receiver through a signal line: a low-pass filter 19→the switch circuit 53→an amplifier 25→an terminal T14.

When these voice signals have been scrambled for privacy, the signals are descrambled by a spectrum inversion circuit 50, thereby releasing the privacy conversation, and the switch circuit 53 is connected in the state reverse to that shown in the figure. That is, the oscillation signal S30 of the oscillating circuit 30 is supplied to a timing signal forming circuit 37 whereby the oscillation signal S30 is frequency-divided into a signal S37 of a frequency slightly higher than the upper limit frequency of the voice signals, for example, into a signal S37 of a frequency of 3.2 kHz as a result of being frequency-divided by 4500. This signal S37 is supplied to an equilibrium modulation circuit 51 as a subcarrier signal.

Then, the voice signals from the demodulation circuit 18 are supplied to the modulation circuit 51 as modulation signals. Signals which are equilibrium-modulated in accordance with the voice signals are taken from the modulation circuit 51. These modulated signals are supplied to a low-pass filter 52 whereby signals of a lower side band, i.e., voice signals whose frequency spectrum has been inverted again to its original frequency spectrum, are taken.

Then, these voice signals are supplied to the speaker 4 through a signal line: the switch circuit 53→an amplifier 25→the terminal T14.

The above is the construction and the operation relating to the voice signals of the receiving circuit 10.

On the other hand, the transmitting circuit 40 forms the voice signals directly into FM signals of an up channel and is provided with a PLL 43. A frequency-division signal S35 from the frequency-dividing circuit 35 is supplied to the PLL 43 as a reference frequency signal. In this way, a signal St of a carrier frequency of the up channel which is in pairs with the down channel, which signal is received by the receiving circuit 10, is taken from the VCO 432 of the PLL 43.

The voice signals from the microphone 5 for the telephone transmitter are supplied to a switch circuit 63 through a signal line: a terminal T15→an amplifier 41→ a low-pass filter 42.

Further, a spectrum inversion circuit 60 is provided to scramble the voice signals to provide privacy thereto. That is, the voice signals from the low-path filter 42 are supplied to the equilibrium modulation circuit 61 as modulation signals, and a frequency-division signal S37 from the forming circuit 37 is supplied to the equilibrium modulation circuit 61 as a subcarrier signal.

In this way, signals which are equilibrium-modulated in accordance with the voice signals are taken from the modulation circuit 61. These modulated signals are supplied to a low-pass filter 62 whereby signals of the lower side band, i.e., voice signals whose frequency spectrum has been inverted are taken, and the voice signals are supplied to the switch circuit 63.

The switch circuit 63 is controlled in the same way as the switch circuit 53 in accordance with a control signal from the terminal T22. That is, voice signals which have not been scrambled, or voice signals which have been scrambled to provide privacy by spectrum inversion, are taken from the switch circuit 63.

The voice signals from the switch circuit 63 are supplied to the VCO 432 as a control signal of the oscillation frequency of the VCO 432 through a switch circuit 47 which is normally connected in the state shown in the figure. In this way, FM signals St of an up channel in pairs with the down channel, which FM signals St are received by the receiving circuit 10 and are FM-modulated in accordance with the voice signals, are taken from the VCO 432.

These FM signals St are taken at a terminal T18 through a drive amplifier 44 and an output amplifier 45, and supplied to the antenna 2 through which these FM signals St are transmitted to the base telephone set.

The above is the construction and the operation relating to the voice signals of the transmission circuit 40.

Construction for Command Signal and Operation

When the command signal CMND from the base telephone set is received, the MSK signal thereof is output from the demodulation circuit 18. This MSK signal is supplied via a band-pass filter 28 to a waveform shaping circuit 29 whereby the MSK signal is formed into an MSK signal in the shape of a rectangular wave. This MSK signal is supplied via a terminal T21 to a microcomputer (not shown) for controlling the system.

Thereupon, in the microcomputer, the command signal CMND is demodulated by distinguishing the difference in the pulse widths of the MSK signals, and processing in accordance with that command signal is performed.

Further, in order to transmit the command signal CMND to the base telephone set, the IC 1 is provided with a conversion circuit 65 for converting the command signal CMND into a digital MSK signal, and a D/A converter 66.

In this case, the conversion circuit 65 has stored in memory or the like data for the digital MSK signal when the bit of the command signal CMND is "0" and data for the digital MSK signal when the bit of the command signal CMND is "1". The digital MSK signal is digital data when a waveform (a waveform of one cycle of a sine-wave signal of a frequency of 2.4 kHz, and a waveform of a half cycle of a sine-wave signal of a frequency of 1.2 kHz) corresponding to one bit of the original command signal CMND is quantized into, for example, 16 samples.

Therefore, the quantization frequency of the digital MSK signal becomes 2.4 [kHz]×16 samples=38.4 [kHz]

When the command signal CMND is transmitted, in the microcomputer, the command signal CMND and an enable signal ENBL indicating the continuation period of the command signal CMND are processed. The signals CMND and ENBL are supplied to the conversion circuit 65 and the formation circuit 37 through the terminals T23 and T24.

In the formation circuit 37, an oscillation signal S30 is frequency-divided by 375 to form a clock P37 at a frequency of 38.4 kHz, and the clock P37 is supplied to the conversion circuit 65 and the D/A converter 66 during the period of the signal ENBL.

In this way, in the conversion circuit 65, the command signal CMND supplied thereto is converted into a digital MSK signal bit by bit. This digital MSK signal is supplied to the D/A converter 66 whereby the digital MSK signal is converted into an analog MSK signal, and this signal is supplied to the switch circuit 47 through a low-pass filter 67.

At this time, the switch circuit 47 is connected in a state reverse to that of the figure in accordance with the enable signal ENBL from the terminal T24 during a period in which an analog MSK signal is being supplied from the D/A converter 66.

In this way, the analog MSK signal from the D/A converter 66 is taken through the switch circuit 47, and this signal is supplied to the VCO 432 of the PLL 43 as a modulated signal. Therefore, the FM signal St which is FM-modulated in accordance with the MSK signal is taken from the VCO 432, and this FM signal St is transmitted to the base telephone set. That is, the command signal CMND is transmitted to the base telephone set.

Setting of Frequency-Dividing Ratio of PLL

PLLs 31 and 43 include variable frequency-dividing circuits 311 and 431. In the PLL 31, in the same way as in an ordinary PLL, the oscillation signal S31 of the VCO 312 is frequency-divided by the frequency-dividing circuit 311. The phase of the frequency-division signal is compared with that of the reference signal S35, and the oscillation frequency of the VCO 312 is controlled in accordance with the comparison output. The same applies to the PLL 43 as well.

Therefore, if it is assumed that f31: the frequency of signal S31

$f31=\omega o/(2\pi)$ f43: the carrier frequency (center frequency) of signal S43

N31: the frequency-dividing ratio of the frequency-dividing circuit 311

N43: the frequency-dividing ratio of the frequency-dividing circuit 431, then normally, as in the case of an ordinary PLL, $$f31=12.5 \text{ [kHz]} \times N31$$

$$f43=12.5 \text{ [kHz]} \times N43$$

where 12.5 [kHz] is the reference frequency of signal S35.

Therefore, if the frequency-dividing ratios N31 and N43 are set according to the channel number CHNO of the channel to be used, transmission/reception can be performed at the channel of that channel number CHNO.

For this reason, a frequency-dividing ratio setting circuit 36 is provided for setting these frequency-dividing ratios N31 and N43. Since this case involves the setting of the frequency-dividing ratios N31 and N43, in the microcomputer, data for the channel number CHNO is formed. This data is supplied to the setting circuit 36 via a terminal T17.

Thereupon, in the setting circuit 36, the data of the channel number CHNO is converted into data of the corresponding frequency-dividing ratios N31 and N43, and the data of the frequency-dividing ratio N31 is supplied to the variable frequency-dividing circuit 311 of the PLL 31 and latched. In this way, the oscillation signal S31 of the frequency f31 equal to the carrier frequency of the FM signal Sr is taken from the VCO 312 of the PLL 31.

The data of the frequency-dividing ratio N43 formed in the setting circuit 36 is supplied to the variable frequency-dividing circuit 431 of the PLL 43 and latched. In this way, the FM signal St of the carrier frequency f43 of the up channel is taken from the VCO 432 of the PLL 43.

Construction and Operation of the Filter

Figure 6:
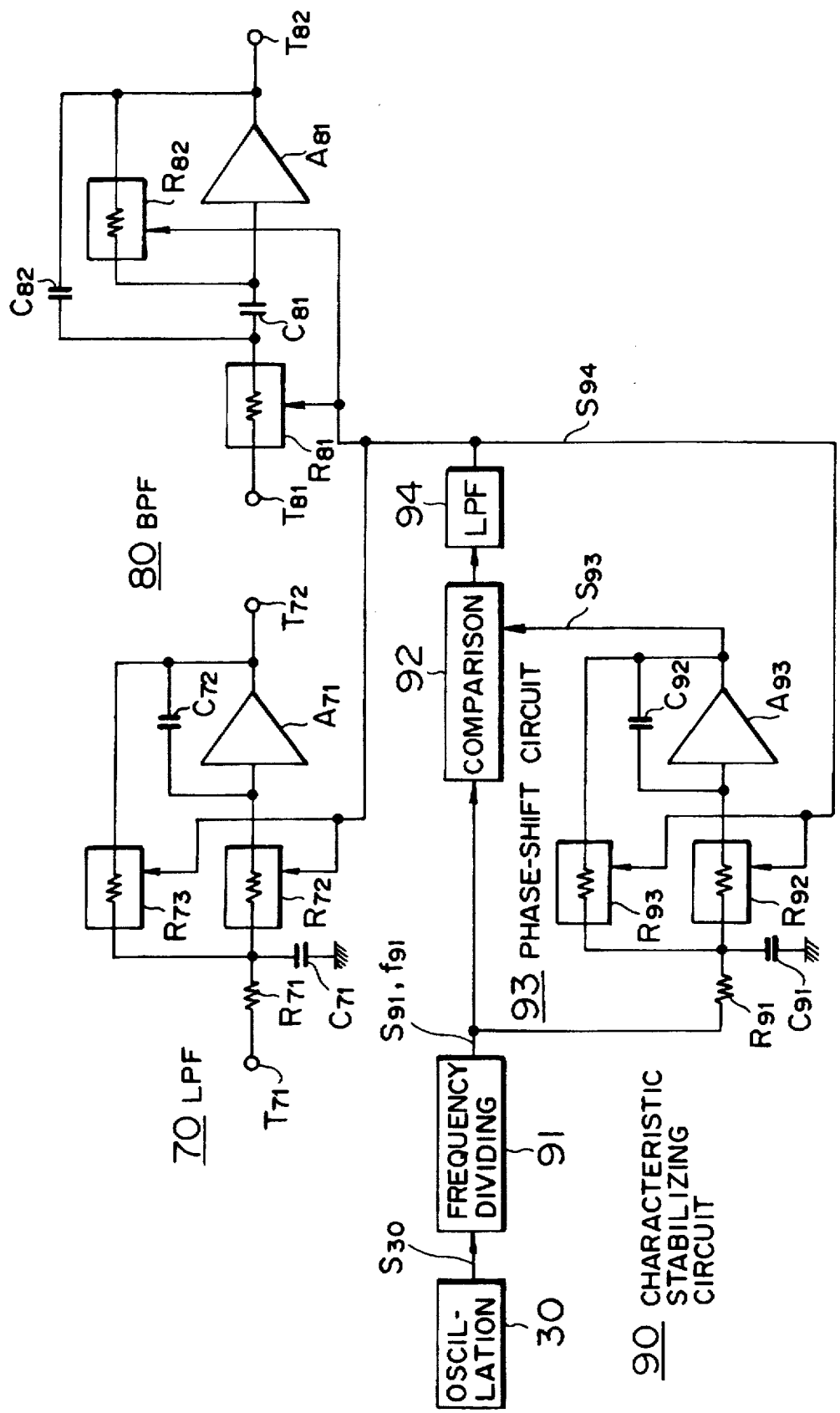
FIG. 6 is a partly enlarged block diagram of the circuits of FIG. 3.

The low-pass filters 19, 42, 52, 62, and 67, and the band-pass filter 28 in the above description can be constructed as, for example, shown in FIG. 6. However, in this figure, the low-pass filters 19 to 67, and the band-pass filter 28 are typified by a low-pass filter 70 and a band-pass filter 80, respectively.

The low-pass filter 70 is constituted of a secondary active filter. An inversion amplifier A71 having a sufficient gain is provided. An input terminal T71 is connected to the input terminal of the inversion amplifier A71 via a resistor R71 and a variable resistor circuit R72, and the output terminal thereof is connected to an output terminal T72.

Also, a capacitor C71 is connected between the connection point between the resistor R71 and the variable resistor circuit R72, and the ground. A capacitor C72 is connected between the output terminal of the amplifier A71 and the input terminal thereof, and a variable resistor circuit R73 is connected between the output terminal of the amplifier A71 and the connection point between the resistor R71 and the variable resistor circuit R72.

Therefore, when a signal is input to terminal T71, the high frequency components are attenuated by elements R71 and C71. The gain of the high frequencies is attenuated in the inversion amplifier A71 because negative feedback is applied to the high frequencies by the capacitor C72. Therefore, this circuit 70 operates as a low-pass filter, and output signals whose high frequencies have been removed are taken at terminal T72.

In this case, the cut-off frequency f70 of the low-pass filter 70 becomes:

$$f70=1/\{2\pi(C71C72R72R73) **0.5\}$$

(X**0.5 indicates the 0.5th power of the value X. The same applies hereinafter.)

Figure 7:
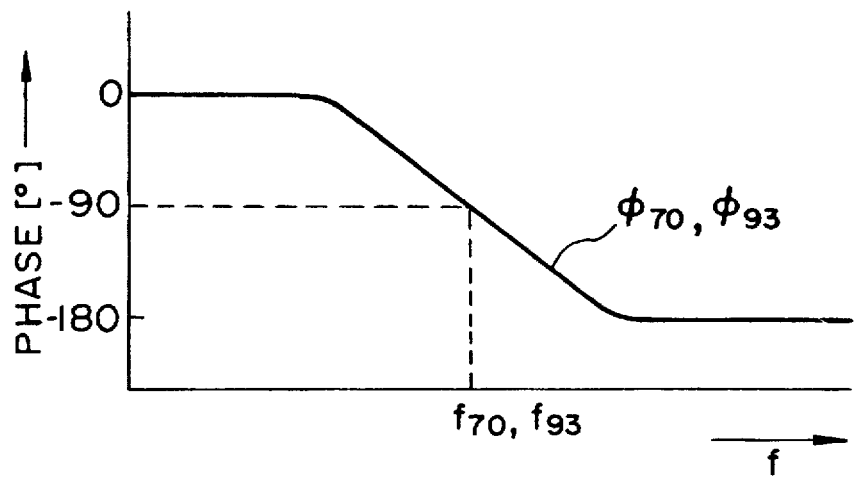
FIG. 7 shows a frequency characteristic.

At this time, the phase φ70 of the output signal of terminal T72 is delayed as the frequency becomes higher as, for example, shown in FIG. 7, and is delayed by 90° at the cut-off frequency f70.

Further, the band-pass filter 80 is constituted of an active filter, and an inversion amplifier A81 having a sufficient gain is provided. An input terminal T81 is connected to the input terminal of the inversion amplifier A81 via a variable resistor R81 and a capacitor C81, and the output terminal thereof is connected to a terminal T82.

A variable resistor circuit R82 is connected between the output terminal of the inversion amplifier A81 and the input terminal thereof, and a capacitor C82 is connected between the output terminal of the inversion amplifier A81 and the connection point between the variable resistor circuit R81 and the capacitor C81.

Therefore, when a signal is input to the terminal T81, the low frequency components thereof are attenuated by elements R81 and C81. The gain of the high frequency in the inversion amplifier A81 is attenuated because negative feedback is applied to the high frequency by the capacitor C82. Therefore, this circuit 80 operates as a band-pass filter, and an output signal whose low and high frequency components have been removed is taken at terminal T82.

In this case, the center frequency f80 and the sharpness Q80 of the band-pass filter 80 are shown below:

$$f80=1/\{2\pi(C81C82R81R82) **0.5\}$$

$$Q80=(½)(R82/R81)**0.5$$

Further, an output signal S94 of a characteristic stabilizing circuit 90 makes it possible to stabilize the cut-off frequency f70 of the low-pass filter 70 and the center frequency f80 of the band-pass filter 80 to the designed values.

More specifically, the oscillation signal S30 from the oscillating circuit 30 is supplied to a frequency-dividing circuit 91 whereby the oscillation signal S30 is frequency-divided by, for example, 2250 and the frequency f91 is formed into a frequency-division signal S91 at 6.4 kHz. This signal S91 is supplied to a phase comparison circuit 92 as a reference signal of a phase (or frequency), and is supplied to a phase-shift circuit 93 as an input signal thereto.

In this example, this phase-shift circuit 93 is constructed similarly to the low-pass filter 70. Elements C91, C92, and R91, and circuits A93, R92, and R93 correspond to elements C71, C72, and R71, and circuits A73, R72, and R73, respectively. The output signal S93 from the phase-shift circuit 93 is supplied to a comparison circuit 92 as a comparison signal.

In this comparison circuit 92, the signal S93 is compared in phase with the signal S91. The compared output is supplied to a low-pass filter 94 whereby a DC signal S94 at a level corresponding to the phase difference between the signal S93 and the signal S91 is taken.

This signal S94 is supplied to the variable resistor circuits R92 and R93 as a control signal of the resistor value thereof, and also supplied to the resistor circuits R72, R73, R81, and R82 as a control signal of the resistor value thereof.

With such a construction, the resistor values of the resistor circuits R92 and R93 vary according to the signal S93. Since the phase-shift circuit 93 is constituted of a low-pass filter similar to the low-pass filter 70, the cut-off frequency f93 thereof becomes:

$$f93=1/\{2\pi(C91C92R92R93)**0.5\}$$

At this time, the phase φ93 of the output signal S93 with respect to the input signal S91, similarly to the phase φ70, is delayed as the frequency becomes higher as, for example, shown in FIG. 7, and is delayed by 90° at the cut-off frequency f93.

At normal time, since in the comparison circuit 92, there is a phase difference of 90° between signal S91 and signal S93. The phase delay of the signal S93 in the phase-shift circuit (low-pass filter) 93 is 90°.

The phase-shift circuit 93 provides a phase delay of 90° to the signal S93 at the cut-off frequency f93. Therefore, at this time, the cut-off frequency f93 becomes equal to the frequency f91 (=6.4 kHz) of the signal S91.

That is, it follows that the cut-off frequency f93 of the phase-shift circuit 93 is controlled to be fed back so that the cut-off frequency f93 becomes equal to the frequency f91 of the signal S91 with the frequency f91 as a reference.

At this time, the cut-off frequency f70 of the low-pass filter 70 is also controlled in accordance with the signal S94 which controls the cut-off frequency f93 of the phase-shift circuit 93. In the IC, the variations in the relative values of the resistor and the capacitor are sufficiently small.

Therefore, if the cut-off frequency f70 of the low-pass filter 70 is assumed to be a designed value equal to the cut-off frequency f93 of the phase-shift circuit 93, the values of the variable resistor circuits R72 and R73 are controlled in the same manner as the values of the variable resistor circuits R92 and R93 according to the signal S94, and the cut-off frequency f70 of the low-pass filter 70 becomes equal to the cut-off frequency f93 of the phase-shift circuit 93. That is, the cut-off frequency f70 of the low-pass filter 70 also becomes equal to the frequency f91 of the signal S91.

Even if the cut-off frequency f70 of the low-pass filter 70 is a designed value different from the cut-off frequency f93 of the phase-shift circuit 93, the value of a corresponding element, when this is formed into an IC, varies at the same ratio in the same direction. As a result, the cut-off frequency f70 of the low-pass filter 70 is corrected to the designed value.

Further, at this time, since the signal S94 is also supplied to the variable resistor circuits R81 and R82, the center frequency f80 of the band-pass filter 80 is also controlled by the signal S94. Therefore, for the same reason, the center frequency f80 of the band-pass filter 80 is corrected to the designed value with the frequency f91 of the signal S91 as a reference.

In this way, according to the circuit of FIG. 6, even if the values of the resistor (the variable resistor circuit) and the capacitor of the low-pass filter 70 and the band-pass filter 80 vary, the values of the variable resistor circuits R72, R73, R81, and R82 are controlled so that the CR product becomes the designed value. Thus, the intended frequency characteristic can be obtained.

For the same reason, even if the values of the resistor and the capacitor are going to vary by temperature, this change is cancelled by the change of the low-pass filter 94, and the frequency characteristic is not varied.

Example of Variable Resistor Circuit

Figure 8:
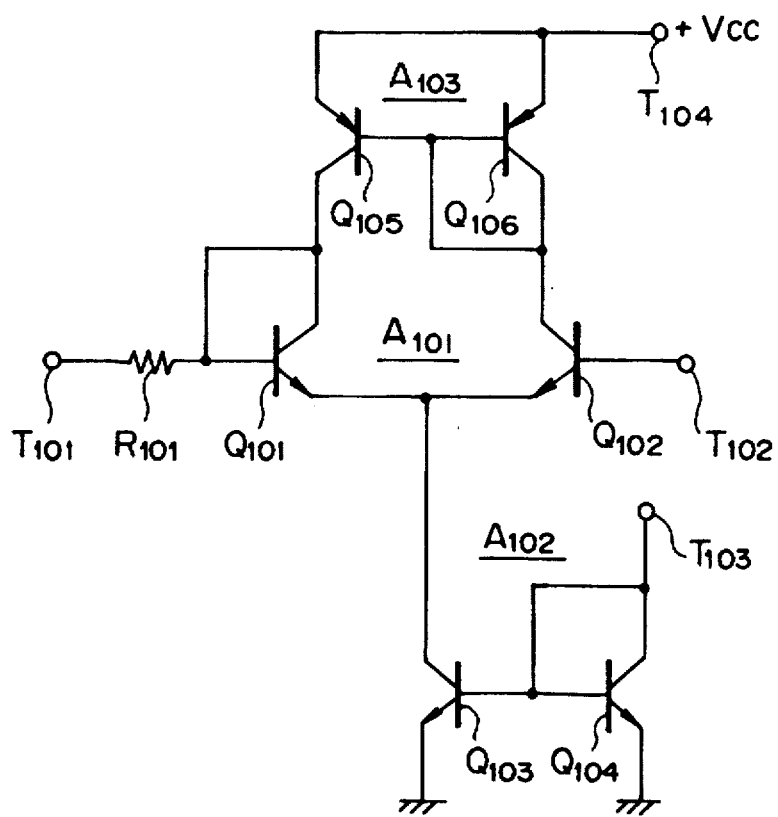
FIG. 8 shows an example of a variable resistor circuit according to the present invention.

FIG. 8 shows a specific example of the variable resistor circuits R71 to R93. More specifically, the emitters of transistors Q101 and Q102 are connected to the collector of a transistor Q103 for a constant current source, and thus a differential amplifier A101 with the ground as the reference potential point is formed. The base of the transistor Q101 is connected to terminal T101 via a resistor R101 (including a case of R101=0), and the base of the transistor Q102 is connected to terminal T102.

Further, the transistors Q103 and Q104 form a current mirror circuit A102 with the ground as a reference potential point. The transistor Q103 is made to operate as the output side, the transistor Q104 is made to operate as the input side, and the collectors thereof are connected to a control terminal T103.

Also, the transistors Q105 and Q106 form a current mirror circuit A103 with a power-supply terminal T104 as a reference potential point, and the transistor Q105 is made to operate as the output side, the transistor Q106 is made to operate as the input side. The collectors of the transistors Q105 and Q106 are connected to the collectors of the transistors Q101 and Q102, respectively.

With such a construction, when it is assumed that

RV: the resistance value between the terminal T101 and the terminal T102, re: the emitter resistance between the transistors Q101 and Q102, then $$RV=R101+2re.$$

The emitter resistance re is inversely proportional to the collector current of the transistor Q103, and the collector current of the transistor Q103 is equal to the control current supplied to the terminal T103 from the current mirror circuit A102.

Therefore, the resistance value RV varies according to the amount of the control current of the terminal T103. Thus, this circuit operates as a variable resistor circuit.

Conclusion

As described above, since in the IC 1 the crystal oscillating circuit is constituted of only the oscillating circuit 30, interference between the oscillating circuits does not occur. As a result, it becomes easy to layout parts and circuits, and size reduction is easy. Further, since only one crystal oscillating circuit is required, costs can be reduced.

Also, one oscillation signal S30 is frequency-divided to form each of the signals S35, P37, S37, and S91. Therefore, the spurious signal has only subharmonic or harmonic signals of the oscillation signal S30 of a single frequency are present. Thus, interference with the system becomes small, and this is advantageous for forming an IC.

Further, since the frequency characteristics of the low-pass filters 13, 19, 23, 42, 52, 62, and 67, and the band-pass filters 16 and 28 use the signal S91 as a reference, the frequency characteristics do not fluctuate or vary.

For the above reasons, as described above, the whole can be integrated into one IC 1.

In addition, although a case in which the IC 1 is used in the sub-telephone set is described above, if terminals T14 and T15 are connected to a four-/two-wire conversion circuit of a base telephone set, and the frequency-dividing ratios N31 and N43 of the variable resistor circuits of PLL 31 and 43 are interchanged with each other, the above-described operation is performed in the base telephone set. At this time, reception of the up channel is performed by the receiving circuit 10, and transmission of the down channel is performed by the transmission circuit 20.

Therefore, this IC 1 can also be used for the base telephone set. That is, the IC 1 can be used in common for the sub-telephone set and the base telephone set.

Others

In the above description, it is possible for the frequency-dividing circuits 33, 35, 37, and 91 to make the portions where the frequency dividing is common to be formed in common. Also, it is possible to form the VCOs 312 and 432 into CR oscillating circuits. Further, it is possible to decode the MSK signal output from the waveform shaping circuit 29 into the command signal CMND and then output it to the terminal T21. Although a case in which the present invention is applied to a cordless telephone set is described in the above, the present invention can be applied to a duplex transmitter/receiver.

Many different embodiments of the present invention may be constructed without departing from the spirit and scope of the present invention. It should be understood that the present invention is not limited to the specific embodiment described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. An integrated circuit, comprising:
    a PLL circuit for generating a local oscillation signal used to convert the frequency of a received signal and for generating a carrier signal for a transmission signal;
    a conversion circuit for converting digital data into signals suitable for transmission using said carrier signal;
    an oscillating circuit for generating a predetermined oscillation signal; and
    a frequency dividing circuit for generating a frequency-division signal supplied to said PLL circuit and said conversion circuit by frequency-dividing said predetermined oscillation signal, wherein said PLL circuit includes a first PLL for generating said local oscillation signal and a second PLL for generating said carrier signal, and said frequency-division signal is supplied to said first and said second PLL circuits.

2. A transmitter/receiver, comprising:
    a harmonic amplifying circuit to which a received signal is input;
    a mixer for converting an output of said harmonic amplifying circuit into an intermediate frequency;
    a PLL circuit for generating a local oscillation signal and supplying it to said mixer and for generating a carrier signal for a transmission signal;
    an intermediate-frequency filter for filtering signals for said mixer;
    a conversion circuit for converting digital data into signals suitable for transmission using said carrier signal;
    an oscillating circuit for generating a predetermined oscillation signal; and
    a frequency dividing circuit for generating a frequency-division signal supplied to said PLL circuit and said conversion circuit by frequency-dividing said predetermined oscillation signal, wherein said intermediate-frequency filter is formed of an active filter.

3. A transmitter/receiver according to claim 2 wherein the frequency characteristic of said intermediate frequency filter is made variable in response to the signal which is produced by frequency-dividing said predetermined oscillation signal.

4. A transmitter/receiver according to claim 3 wherein said active filter comprises a variable resistor for forming said frequency characteristic, and the resistance value of said variable resistor is made variable in response to the signal which is produced by frequency-dividing said predetermined oscillation signal.

5. A transmitter/receiver comprising:
    a harmonic amplifying circuit to which a received signal is input;
    a mixer for converting an output of said harmonic amplifying circuit into an intermediate frequency;
    a PLL circuit for generating a local oscillation signal and supplying it to said mixer and for generating a carrier signal for a transmission signal;
    an intermediate-frequency filter for filter for filtering signals for said mixer;
    a conversion circuit for converting digital data into signals suitable for transmission using said carrier signal;
    an oscillating circuit for generating a predetermined oscillation signal; and
    a frequency dividing circuit for generating a frequency-division signal supplied to said PLL circuit and said conversion circuit by frequency-dividing said predetermined oscillation signal, wherein said intermediate frequency is substantially zero.

6. A transmitter/receiver according to claim 5 further comprising changing means for changing a local oscillation frequency to change a receiving frequency.

7. An integrated circuit, comprising:
    a PLL circuit for generating a local oscillation signal used to convert the frequency of a received signal and for generating a carried signal for a transmission signal;
    a conversion circuit for converting digital data into signals suitable for transmission using said carrier signal;
    a scramble/descramble circuit for scrambling/descrambling a transmission/received signal;
    an oscillating circuit for generating a predetermined oscillation signal; and
    a frequency dividing circuit for generating a frequency-division signal supplied to said PLL circuit, said conversion circuit, and said scramble/descramble circuit by frequency-dividing said predetermined oscillation signal.

8. A transmitter/receiver, comprising:
    a harmonic amplifying circuit to which a received signal is input;
    a mixer for converting an output of said harmonic amplifying circuit into an intermediate frequency;
    a PLL circuit for generating a local oscillation signal and supplying it to said mixer and for generating a carrier signal for a transmission signal;
    an intermediate-frequency filter for filtering signals from said mixer;
    a conversion circuit for converting digital data into signals suitable for transmission using said carrier signal;
    a scramble/descramble circuit for scrambling/descrambling a transmission/received signal;
    an oscillating circuit for generating a predetermined oscillation signal; and
    a frequency dividing circuit for generating a frequency-division signal supplied to said PLL circuit, said conversion circuit, and said scramble/descramble circuit by frequency-dividing said predetermined oscillation signal.

9. An integrated circuit, comprising:
- a PLL circuit for generating a local oscillation signal used to convert the frequency of a received signal and for generating a carrier signal for a transmission signal;
- a scramble/descramble circuit for scrambling/descrambling a transmission/received signal;
- an oscillating circuit for generating a predetermined oscillation signal; and
- a frequency dividing circuit for generating a frequency-division signal supplied to said PLL circuit and said scramble/descramble circuit by frequency-dividing said predetermined oscillation signal, wherein said PLL circuit includes a first PLL for generating said local oscillation signal and a second PLL for generating said carrier signal, and said frequency-division signal is supplied to said first and said second PLL circuits.

10. A transmitter/receiver, comprising:
- a harmonic amplifying circuit to which a received signal is input;
- a mixer for converting an output of said harmonic amplifying circuit into an intermediate frequency;
- a PLL circuit for generating a local oscillation signal and supplying it to said mixer and for generating a carrier signal for a transmission signal;
- an intermediate-frequency filter for filtering signals from said mixer;
- a scramble/descramble circuit for scrambling/descrambling a transmission/received signal;
- an oscillating circuit for generating a predetermined oscillation signal; and
- a frequency dividing circuit for generating a frequency-division signal supplied to said PLL circuit and said scramble/descramble circuit by frequency-dividing said predetermined oscillation signal, wherein said PLL circuit includes a first PLL for generating said local oscillation signal and a second PLL for generating said carrier signal, and said frequency-division signal is supplied to said first and said second PLL circuits.

* * * * *